United States Patent
Tsai (10) Patent No.: US 7,823,049 B2
(45) Date of Patent: Oct. 26, 2010

(54) METHODS AND APPARATUSES FOR GENERATING PARITY SYMBOLS FOR DATA BLOCK

(75) Inventor: Shang-Nien Tsai, Hsinchu (TW)

(73) Assignee: MediaTek Inc., Science-Based Industrial Park, Hsin-Chu (TW)

( * ) Notice: Subject to any disclaimer, the term of this patent is extended or adjusted under 35 U.S.C. 154(b) by 1022 days.

(21) Appl. No.: 11/557,944

(22) Filed: Nov. 8, 2006

(65) Prior Publication Data

US 2007/0220407 A1    Sep. 20, 2007

Related U.S. Application Data

(60) Provisional application No. 60/743,497, filed on Mar. 15, 2006.

(51) Int. Cl.
  *H03M 13/00* (2006.01)
(52) U.S. Cl. .................. 714/781; 714/784; 714/761
(58) Field of Classification Search ............ 714/781, 714/784, 756, 761
  See application file for complete search history.

(56) References Cited

U.S. PATENT DOCUMENTS

| | | | |
|---|---|---|---|
| 4,763,332 A | | 8/1988 | Glover |
| 4,764,927 A | * | 8/1988 | Izumita et al. ............ 714/761 |
| 4,868,827 A | * | 9/1989 | Yamada et al. ............ 714/756 |
| 5,241,546 A | | 8/1993 | Peterson et al. |
| 5,361,266 A | | 11/1994 | Kodama et al. |
| 5,444,719 A | | 8/1995 | Cox et al. |
| 5,974,580 A | | 10/1999 | Zook et al. |
| 5,996,105 A | | 11/1999 | Zook |
| 6,115,837 A | | 9/2000 | Nguyen et al. |
| 6,158,040 A | | 12/2000 | Ho |
| 6,163,871 A | | 12/2000 | Yang |
| 6,279,135 B1 | | 8/2001 | Nguyen et al. |
| 6,363,511 B1 | | 3/2002 | Massoudi |
| 6,370,671 B1 | * | 4/2002 | Pan et al. ............ 714/784 |
| 6,415,413 B1 | * | 7/2002 | Pan et al. ............ 714/784 |
| 6,446,234 B1 | | 9/2002 | Cox et al. |
| 6,466,736 B1 | | 10/2002 | Chen et al. |
| 6,470,473 B1 | | 10/2002 | Iwasa |
| 6,615,387 B1 | | 9/2003 | Williamson et al. |
| 6,651,208 B1 | | 11/2003 | Tran et al. |
| 6,691,203 B1 | | 2/2004 | Chen et al. |
| 6,718,506 B1 | | 4/2004 | Sebastian et al. |
| 6,742,156 B2 | | 5/2004 | Shieh |
| 6,742,157 B2 | | 5/2004 | Shieh et al. |
| 6,907,559 B2 | | 6/2005 | Hall et al. |
| 6,944,805 B2 | | 9/2005 | Seki |
| 2002/0083394 A1 | | 6/2002 | Hall et al. |

FOREIGN PATENT DOCUMENTS

TW    I233606    6/2005

* cited by examiner

*Primary Examiner*—Fritz Alphonse
(74) *Attorney, Agent, or Firm*—Winston Hsu; Scott Margo; Min-Lee Teng (57) ABSTRACT

Methods and apparatus for generating parity symbols for a data block are disclosed. One of the proposed methods includes: determining a multiplicator polynomial for a first-direction symbol line of the data block, receiving a set of symbols on the first-direction symbol line, multiplying each of the set of symbols by the multiplicator polynomial to generate a set of product polynomials, repeating the determining, receiving, and multiplying steps for a plurality of first-direction symbol lines of the data block to generate a plurality of sets of product polynomials, and summing the plurality of sets of product polynomials to generate a set of parity polynomials. The coefficients of the set of parity polynomials constitute parity symbols of the data block.

22 Claims, 7 Drawing Sheets

METHODS AND APPARATUSES FOR GENERATING PARITY SYMBOLS FOR DATA BLOCK

CROSS REFERENCE TO RELATED APPLICATIONS

This application claims the benefit of U.S. Provisional Application No. 60/743,497, which was filed on Mar. 15, 2006 and is incorporated herein by reference.

BACKGROUND

The embodiments relate to error correction techniques, and more particularly, to methods and apparatuses for generating error correction codes corresponding to data with a block configuration.

In data storage systems and data transmission systems, error correction techniques are sometimes utilized to improve data reliability. For example, data to be written onto an optical disc need to be encoded to generate corresponding error correction codes. These error correction codes are then written onto the optical disc so that a data reproducing system, such as an optical disc drive, is able to check and correct errors within the retrieved error correction codes and accordingly reproduce the original data.

Figure 1:
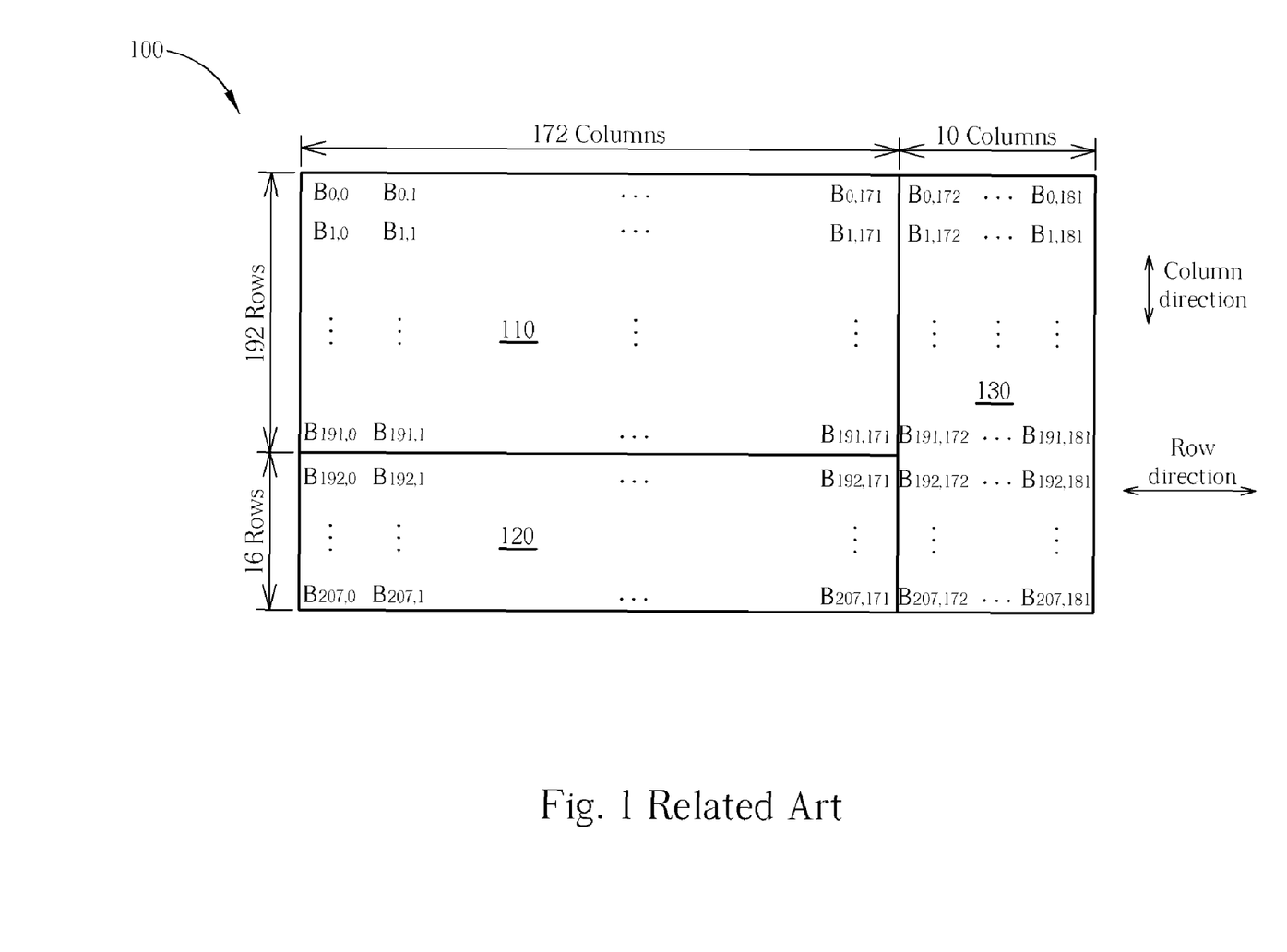
FIG. 1 shows a typical ECC block utilized in a DVD or an HD-DVD.

FIG. 1 shows a typical error correction code (ECC) block 100 utilized in a digital versatile disc (DVD) or a high definition DVD (HD-DVD). The ECC block 100 is composed of an original data block 110, a column-direction parity block 120, and a row-direction parity block 130. The column-direction parity block 120 and the row-direction parity block 130 are referred to as Parity Outer (PO) and Parity Inner (PI) of the ECC block 100 respectively. Generally speaking, the original data block 110 is made up of sixteen data sectors and includes 192 rows and 172 columns. The 192 rows and 172 columns form 33,024 intersections and therefore allow a total amount of 33,024 data symbols, each of which is one byte in size, to be included in the original data block 110. The column-direction parity block 120 has 172 columns, each of which includes 16 parity symbols. The row-direction parity block 130 has 208 rows, each of which includes 10 parity symbols. Each of the parity symbols of the column-direction parity block 120 and the row-direction parity block 130 is one byte in size. Consisting of the original data block 110, the column parity block 120, and the row parity block 130, the ECC block 100 as a whole has 208 rows and 182 columns and therefore allows a total amount of 37,856 bytes of data to be included therein.

In the related art, to generate the ECC block 100 the original data block 110 is first column-wise accessed to calculate parity symbols that form the column-direction parity block 120. Then, the original data block 110 and the column-direction parity block 120 are row-wise accessed to calculate parity symbols that form the row-direction parity block 130. During the ECC generation process, a storage medium must be utilized to provide buffer space. However, for some kinds of storage media, such as dynamic random access memory (DRAM), accessing data in one direction may be less efficient than in another direction. The above-mentioned ECC generation procedure is not efficient if the storage media that provides buffering space is inherently unsuitable for either row-wise access or column-wise access. For example, if a DRAM is column-wise accessed, page missing will be encountered frequently, causing an extra clock cycle to be consumed each time.

The above-mentioned ECC generation procedure also prohibits the potential simultaneous processing of multiple tasks due to the conflicting data accessing directions. Therefore the overall efficiency of ECC generation procedure is limited.

SUMMARY

An exemplary embodiment of a method for generating parity symbols for a data block is disclosed and comprises: determining a multiplicator polynomial for a first-direction symbol line of the data block, receiving a set of symbols on the first-direction symbol line, the set of symbols corresponding to a set of second-direction symbol lines of the data block respectively, multiplying each of the set of symbols by the multiplicator polynomial to generate a set of product polynomials for the set of second-direction symbol lines, repeating the determining, receiving, and multiplying steps for a plurality of first-direction symbol lines of the data block to generate a plurality of sets of product polynomials for the set of second-direction symbol lines, and summing the plurality of sets of product polynomials to generate a set of parity polynomials for the set of second-direction symbol lines. The coefficients of the set of parity polynomials constitute parity symbols of the set of second-direction symbol lines.

An exemplary embodiment of an apparatus for generating parity symbols for a data block is disclosed and comprises: a determining module for determining a multiplicator polynomial for a first-direction symbol line of the data block, a multiplication module coupled to the determining module, for receiving a set of symbols on the first-direction symbol line and multiplying each of the set of symbols by the multiplicator polynomial to generate a set of product polynomials, the set of symbols corresponding to a set of second-direction symbol lines of the data block respectively, and a summation module coupled to the multiplication module, for summing a plurality of sets of product polynomials generated by the multiplication module to generate a set of parity polynomials for the set of second-direction symbol lines. The coefficients of the set of parity polynomials constitute parity symbols of the set of second-direction symbol lines.

Exemplary embodiments of an apparatus for generating a second-direction parity block and a first-direction parity block according to an original data block are disclosed. The apparatus comprises a first-direction-wise second-direction parity generation module for calculating the second-direction parity block by accessing the original data block along the first-direction. A first-direction parity generation module is coupled to the first-direction-wise second-direction parity generation module and calculates the first-direction parity block by accessing the original data block and the second-direction parity block generated by the first-direction-wise second-direction parity generation module along the first-direction.

An embodiment of an apparatus for generating a second-direction parity block and a first-direction parity block according to an original data block are disclosed. The apparatus comprises a second-direction parity generation module for calculating the second-direction parity block by second-direction-wise accessing the original data block. A second-direction-wise first-direction parity generation module is coupled to the first parity generation module and calculates the first-direction parity block by second-direction-wise accessing the original data block and the second-direction parity block generated by the first parity generation module.

These and other objectives of the present invention will no doubt become obvious to those of ordinary skill in the art after reading the following detailed description of the preferred embodiment that is illustrated in the various figures and drawings.

DETAILED DESCRIPTION

Certain terms are used throughout the description and following claims to refer to particular components. As one skilled in the art will appreciate, electronic equipment manufacturers may refer to a component by different names. This document does not intend to distinguish between components that differ in name but not in function. In the following description and in the claims, the terms "include" and "comprise" are used in an open-ended fashion, and thus should be interpreted to mean "include, but not limited to . . .". Also, the term "couple" is intended to mean either an indirect or direct electrical connection. Accordingly, if one device is coupled to another device, that connection may be through a direct electrical connection, or through an indirect electrical connection via other devices and connections.

The embodiments allow parity symbols along a second direction to be calculated through accessing data along a first direction. Taking the ECC block 100 shown in FIG. 1 as an example, if the row direction and column direction are treated as the first direction and second direction respectively, the rows and columns of the original data block 110 are termed as first-direction symbol lines and second-direction symbol lines respectively. The column-direction parity block 120 and the row-direction parity block 130 are termed as a second-direction parity block and first-direction parity block respectively. On the other hand, if the row direction and column direction are treated as the second direction and first direction respectively, the rows and columns of a source data block, which is composed of the original data block 110 and the column-direction parity block 120, are also termed as second-direction symbol lines and first-direction symbol lines respectively. The column-direction parity block 120 and the row-direction parity block 130 are termed as a first-direction parity block and second-direction parity block.

In the following embodiments the ECC block 100 FIG. 1 is used as an example, and the row direction and column direction are treated as the first direction and second direction respectively. The embodiments allows the column-direction parity block 120 to be generated through row-wise accessing the original data block 110. By simply interchanging the first direction and the second direction, one of ordinary skill in the art can further understand how the row-direction parity block 130 can be generated through column-wise accessing a source data block consisting of the original data block 110 and the column-direction parity block 120.

Since in the ECC block 100, the size of each of the data symbols and parity symbols is one byte, in the following descriptions the data symbols and parity symbols will be termed as data bytes and parity bytes respectively.

In the ECC block 100, each of the beginning 172 columns constitutes a 208-byte-long ECC codeword. Taking a $(K+1)^{th}$ column of the ECC block 100 as an example, where K in an integer between 0 and 171, it consists of 208 bytes ($B_{0,K}$~$B_{207,K}$). The beginning 192 bytes ($B_{0,K}$~$B_{191,K}$) carry the data information and the ending 16 bytes ($B_{192,K}$~$B_{207,K}$) are parity checks. According to the pertinent specifications, a polynomial taking the 208 bytes as coefficients in sequence is required to be a multiple of a generation polynomial G(x), which is of order 16. Therefore, in the related art the end 16 bytes are generated by performing time-consuming division operations on the beginning 192 bytes. However, in practice if all the remainder polynomials $R_{207}(x)$, $R_{206}(x)$, . . . , and $R_{16}(x)$ of dividing $x^{207}$, $x^{206}$, . . . , and $x^{16}$ by G(x) are known, the end 16 bytes can be calculated utilizing the following equation:

$$B_{192,K}x^{15}+B_{193,K}x^{14}+\ldots+B_{206,K}x^1+B_{207,K}=\\ B_{0,K}R_{207}(x)+B_{1,K}R_{206}(x)+\ldots+B_{190,K}R_{17}(x)+\\ B_{191,K}R_{16}(x) \quad (1)$$

With this idea in mind, the parity symbols of the $(K+1)^{th}$ column of the ECC block 100 can be calculated by multiplication operations instead of division operations. Since a multiplication operation normally requires fewer clock cycles than a division operation, a lot of clock cycles can be saved with the above-mentioned idea. Therefore parity symbols are generated more time-efficiently.

One intuitional approach to provide the remainder polynomials $R_{207}(x)$, $R_{206}(x)$, . . . , and $R_{16}(x)$ when they are needed in the calculation is to pre-store all of them in a table. Each of the remainder polynomials can then be retrieved through table look-up according to the row order of a currently processed row. More specifically, if a $(J+1)^{th}$ row of the original data block 110 is processed, where J is an integer between 0 and 191, the remainder polynomial $R_{207-J}(x)$ is retrieved. However, each of the remainder polynomials consists of 16 bytes of coefficients. Storing all the remainder polynomials in the table inevitably takes up much memory space and therefore causes the hardware cost to be increased.

In practice, to calculate the end 16 bytes of the ECC codeword, the beginning 192 bytes are accessed in an increasing order (from $B_{0,K}$ to $B_{191,K}$). This means that the remainder polynomials are also utilized in turn, more specifically, in a decreasing order (from $R_{207}(x)$ to $R_{16}(x)$). If there is a recursive relation that allows $R_{N-1}(x)$ to be predicted according to $R_N(x)$, where N is an integer between 17 and 207, only one of the 192 remainder polynomials needs be saved at each moment. The initially saved remainder polynomial is $R_{207}(x)$. Then, the resting remainder polynomials are calculated in turn. Each time a remainder polynomial $R_{N-1}(x)$ is calculated, the previously utilized remainder polynomial $R_N(x)$ can be discarded and the memory space used to save $R_N(x)$ can be reused to save $R_{N-1}(x)$. Therefore, less memory space is required, and hardware cost will be significantly reduced.

To deduce the recursive relation, $x^n$ is first divided by the generation polynomial G(x) to establish the following equation:

$$x^n = G(x)Q_n(x)+R_n(x) \quad (2)$$

where $Q_n(x)$ and $R_n(x)$ are the quotient polynomial and remainder polynomial of dividing $x^n$ by G(x), respectively.

Next, the polynomials G(x), $Q_n(x)$, and $R_n(x)$ are divided by x respectively to establish the following equations:

$$G(x)=G'(x)x+Cg \quad (3)$$

$$Q_n(x)=Q'_n(x)x+Cq(n) \quad (4)$$

$$R_n(x)=R'_n(x)x+Cr(n) \quad (5)$$

Equations (4) and (5) are substituted into equation (2) to get:

$$x^n = G(x)[Q'_n(x)x + Cq(n)] + [R'_n(x)x + Cr(n)] \quad (6)$$

Both sides of equation (6) are divided by x and then equation (3) is substituted into it to obtain:

$$x^{n-1} = G(x)Q'_n(x) + R'n(x) + [G(x)Cq(n) + Cr(n)]/x = G(x)Q'_n(x) + R'_n(x) + \{[G'(x)x + Cg]Cq(n) + Cr(n)\}/x = G(x)Q'_n(x) + R'_n(x) + G'(x)Cq(n) + [CgCq(n) + Cr(n)]/x \quad (7)$$

The left hand side of equation (7) is not a fractional polynomial, consequently:

$$CgCq(n) + Cr(n) = 0 \quad (8)$$

$$Cq(n) = -Cr(n)/Cg \quad (9)$$

Equation (9) is substituted into equation (7) to obtain:

$$x^{n-1} = G(x)Q'_n(x) + R'n(x) - Cr(n)[G'(x)/Cg] \quad (10)$$

Therefore:

$$R_{n-1}(x) = R'n(x) - Cr(n)[G'(x)/Cg] \quad (11)$$

Equation (11) is the demanded recursive equation, where $R'_n(x)$ can be obtained by simply shifting $R_n(x)$, $Cr(n)$ is constant terms of $R_n(x)$, and $[G'(x)/Cg]$ is a fixed polynomial determined by $G(x)$.

As mentioned, when the beginning 192 bytes are accessed in an increasing order, the recursive equation can be used to calculate a next remainder polynomial $R_{n-1}(x)$ according to a previous remainder polynomial $R_n(x)$, where n is an integer between 207 and 17. Since the remainder polynomials $R_{206}(x)$, $R_{205}(x)$, ..., and $R_{16}(x)$ can be calculated recursively, only one of the 192 remainder polynomials needs to be saved. The initially saved remainder polynomial is $R_{207}(x)$.

Similarly, if the beginning 192 bytes are accessed in a decreasing order (from $B_{191,K}$ to $B_{0,K}$), the remainder polynomials will be utilized in an increasing order (from $R_{16}(x)$ to $R_{207}(x)$). Another recursive equation, which can be easily deduced, allows $R_{N+1}(x)$ to be predicted according to $R_N(x)$, where N is an integer between 16 and 206. Still, only one of the 192 remainder polynomials needs to be saved at each moment. More specifically, the initially saved remainder polynomial is $R_{16}(x)$. Then, the resting remainder polynomials are calculated in turn. Each time a remainder polynomial $R_{N+1}(x)$ is calculated, the previously utilized remainder polynomial $R_N(x)$ can be discarded and the memory space used to save $R_N(x)$ can be reused to save $R_{N+1}(x)$. Therefore, less memory space is required, and hardware cost will be significantly reduced.

Figure 2:
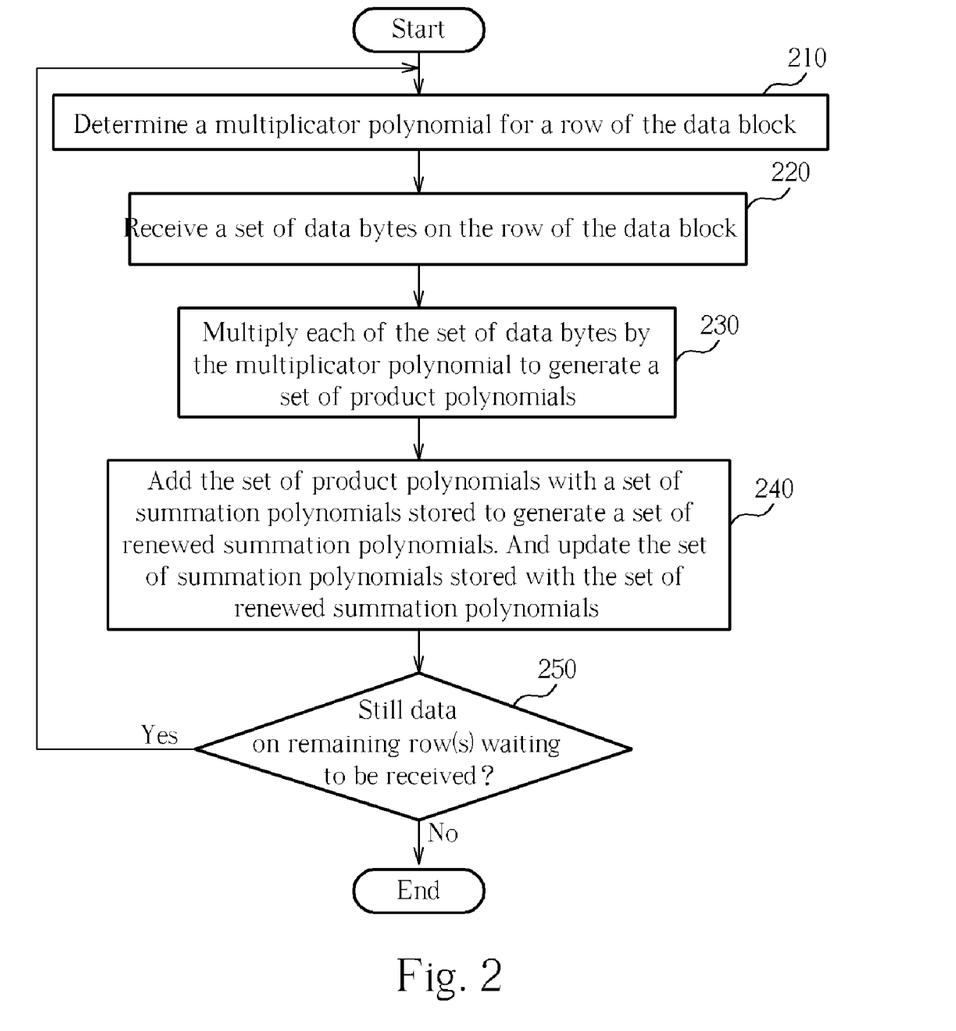
FIG. 2 shows a flowchart illustrating an exemplary row-wise column parities generation method.
Figure 3:
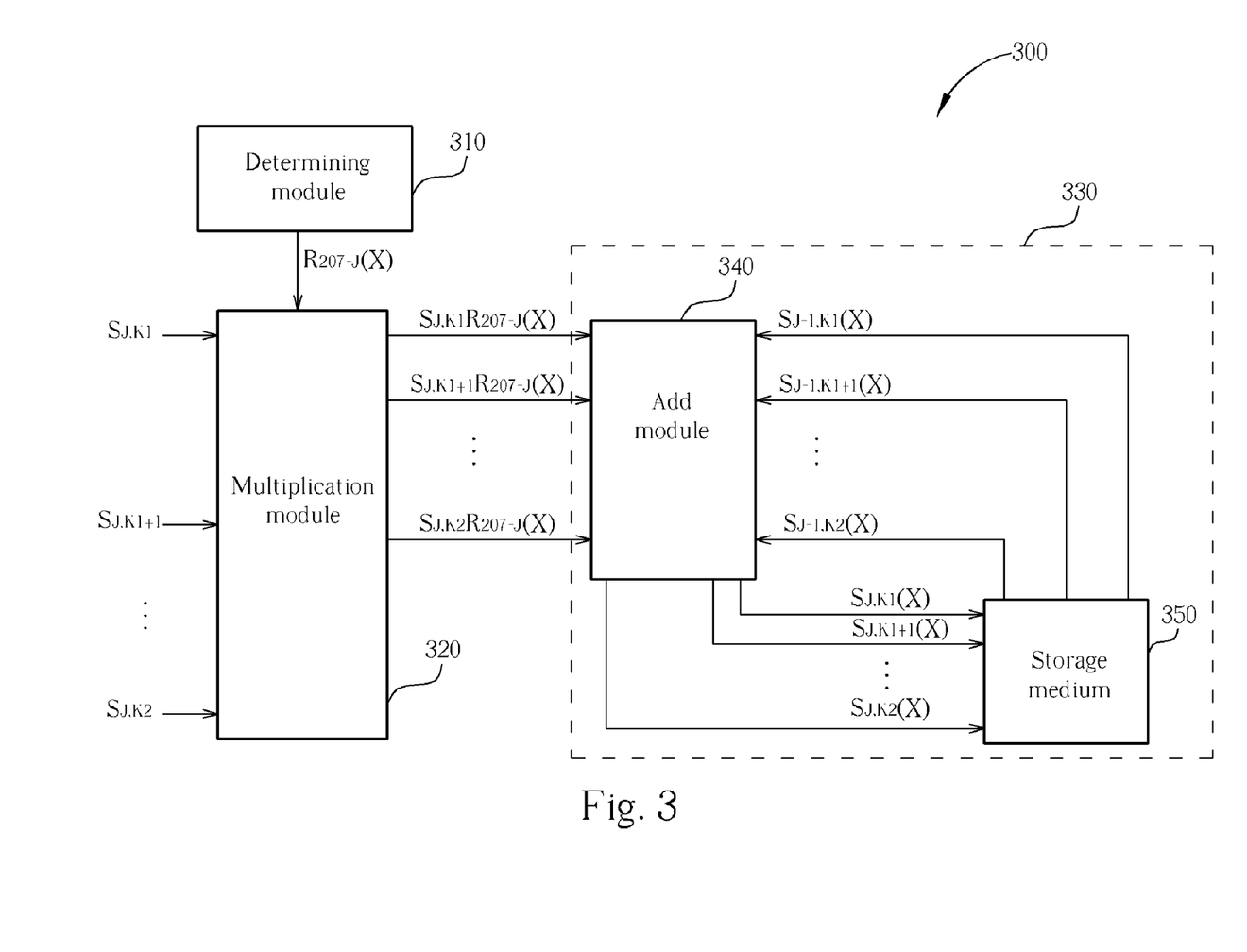
FIG. 3 shows an exemplary apparatus that executes the flowchart shown in FIG. 2.

Please refer to FIG. 2 and FIG. 3. FIG. 2 shows a flowchart illustrating an exemplary row-wise column parities generation method. FIG. 3 shows an exemplary apparatus that executes the flowchart shown in FIG. 2. The apparatus 300 shown in FIG. 3 comprises a determining module 310, a multiplication module 320, and a summation module 330. The summation module 330 comprises an add module 340 and a storage medium 350. Throughout the following description the ECC block 100 shown in FIG. 1 is taken as an example. The flowchart shown in FIG. 2 with the apparatus 300 shown in FIG. 3 allows the column-direction parity block 120 to be generated through row-wise accessing the original data block 110. The flowchart includes the following steps.

Step 210: The determining module 310 determines a multiplicator polynomial for a row of the original data block 110. Throughout the flowchart, the determining module 310 performs step 220 for 192 times. When performing step 220 for the $(J+1)^{th}$ time, where J is an integer between 0 and 191, the determining module 310 utilizes the remainder polynomial $R_{207-J}(x)$ as a multiplicator polynomial for the $(J+1)^{th}$ row. If all the remainder polynomial remainder polynomials $R_{207}(x)$, $R_{206}(x)$, ..., and $R_{16}(x)$ are pre-stored in a table managed by the determining module 310, looking up the table according to the row order J+1 can enable the determining module 310 to easily find the required remainder polynomial $R_{207-J}(x)$. If, on the other hand, the recursive equation (11) is used, then the determining module 310 can produce a remainder polynomial according to the recursive equation (11) and a previously utilized remainder polynomial.

Step 220: The apparatus 300 receives a set of data bytes on the row of the original data block 110. The set of data bytes corresponds to a set of columns of the original data block 110 respectively. Throughout the flowchart, the apparatus 300 performs step 210 for 192 times. When performing step 210 for the $(J+1)^{th}$ time, the apparatus receives a set of data bytes on the $(J+1)^{th}$ row of the original data block 110. More specifically, the set of data byte comprises $B_{J,K1}, B_{J,K1+1}, \ldots$, and $B_{J,K2}$, where K1 and K2 are integers between 0 and 171, and K2 is larger than K1. Under an extreme and preferable situation, K1 and K2 equal 0 and 171 respectively. The set of columns corresponding to the set of data bytes $\{B_{J,K1}, B_{J,K1+1}, \ldots,$ and $B_{J,K2}\}$ comprises the $(K1+1)^{th}$, $(K1+2)^{th}$, ..., and $(K2+1)^{th}$ columns of the original data block 110. Please note that the sequence of performing steps 210 and 220 can be reversed, or the two steps can be performed simultaneously.

Step 230: The multiplication module 320 multiplies each of the set of data bytes by the multiplicator polynomial to generate a set of product polynomials for the set of columns. Throughout the flowchart, the multiplication module 320 performs step 230 for 192 times. When performing step 230 for the $(J+1)^{th}$ time, the multiplication module 320 multiplies each of the set of data bytes $\{B_{J,K1}, B_{J,K1+1}, \ldots,$ and $B_{J,K2}\}$ by the multiplicator polynomial $R_{207-J}(x)$ to generate a set of product polynomials $\{B_{J,K1}R_{207-J}(x), B_{J,K1+1}R_{207-J}(x), \ldots,$ and $B_{J,K2}R_{207-J}(x)\}$.

Step 240: The add module 340 adds the set of product polynomials with a set of summation polynomials stored in the storage medium 350 to generate a set of renewed summation polynomials. The add module 330 also updates the set of summation polynomials stored in the storage medium 540 with the set of renewed summation polynomials. Throughout the flowchart, step 240 is performed for 192 times. When performing step 240 for the first time, all of the set of summation polynomials equal to zero and therefore the set of product polynomials are directly utilized as the set of renewed summation polynomials. In other words, after step 240 is performed for the first time, the renewed summation polynomials $\{S_{0,K1}(x), S_{0,K1+1}(x), \ldots,$ and $S_{0,K2}(x)\}$ stored in the storage medium 540 is $\{B_{0,K1}R_{207}(x), B_{0,K1+1}R_{207}(x), \ldots,$ and $B_{0,K2}R_{207}(x)\}$. Then, when performing step 240 for the $(M+1)^{th}$ time, where M is an integer between 1 and 191, the set of summation polynomials $\{S_{M-1,K1}(x), S_{M-1,K1+1}(x), \ldots,$ and $S_{M-1,K2}(x)\}$ is $\{[B_{0,K1}R_{207}(x) + B_{1,K1}R_{206}(x) + \ldots + B_{M-1,K1}R_{208-M}(x)], [B_{0,K1+1}R_{207}(x) + B_{1,K1+1}R_{206}(x) + \ldots + B_{M-1,K1+1}R_{208-M}(x)], \ldots,$ and $[B_{0,K2}R_{207}(x) + B_{1,K2}R_{206}(x) + \ldots + B_{M-1,K2}R_{208-M}(x)]\}$. The set of product polynomials that is going to be added into the set of summation polynomials is $\{B_{M,K1}R_{207-M}(x), B_{M,K1+1}R_{207-M}(x), \ldots,$ and $B_{M,K2}R_{207-M}(x)\}$. The set of renewed summation polynomials $\{S_{M,K1}(x), S_{M,K1+1}(x), \ldots,$ and $S_{M,K2}(x)\}$ becomes $\{[B_{0,K1}R_{207}(x) + B_{1,K1}R_{206}(x) + \ldots + B_{M,K1}R_{207-M}(x)], [B_{0,K1+1}R_{207}(x) + B_{1,K1+1}R_{206}(x) + \ldots + B_{M,K1+1}R_{207-M}(x)], \ldots,$ and $[B_{0,K2}R_{207}(x) + B_{1,K2}R_{206}(x) + \ldots + B_{M,K2}R_{207-M}(x)]\}$.

Step 250: If there are still data on remaining row(s) to be received, go back to step 210; otherwise, the process ends.

With the flowchart, the final generated set of summation polynomials $\{S_{191,K1}(x), S_{191,K1+1}(x), \ldots,$ and $S_{191,K2}(x)\}$ is $\{[B_{0,K1}R_{207}(x)+B_{1,K1}R_{206}(x)+ \ldots +B_{191,K1}R_{16}(x)],$ $[B_{0,K1+1}R_{207}(x)+B_{1,K1+1}R_{206}(x)+ \ldots +B_{191,K1+1}R_{16}(x)], \ldots,$ and $[B_{0,K2}R_{207}(x)+B_{1,K2}R_{206}(x)+ \ldots +B_{191,K2}R_{16}(x)]\}$ and serves as a set of parity polynomials $\{P_{K1}(x), P_{K1+1}(x), \ldots, P_{K2}(x)\}$. The column parity block 120 comprises coefficients of the parity polynomials. For example, a parity polynomial $P_{K3}(x)$, which corresponds to the $(K3+1)^{th}$ column of the original data block 110, equals the sum of $B_{0,K3}R_{207}(x), B_{1,K3}R_{206}(x), \ldots, B_{191,K3}R_{16}(x)$, where K3 is an integer between K1 and K2. The coefficients of the parity polynomial $P_{K3}(x)$ constitute the column parities of the $(K3+1)^{th}$ column of the original data block 110. More specifically, the $L^{th}$ order coefficient of the parity polynomial $P_{K3}(x)$ will be utilized as $B_{207-L,K3}$, where L is an integer between 0 and 15.

In addition, the fact that first-direction parities can be generated by accessing the data symbols along the second-direction makes efficient structures now feasible. Some examples are illustrated through FIG. 4 to FIG. 7.

Figure 4:
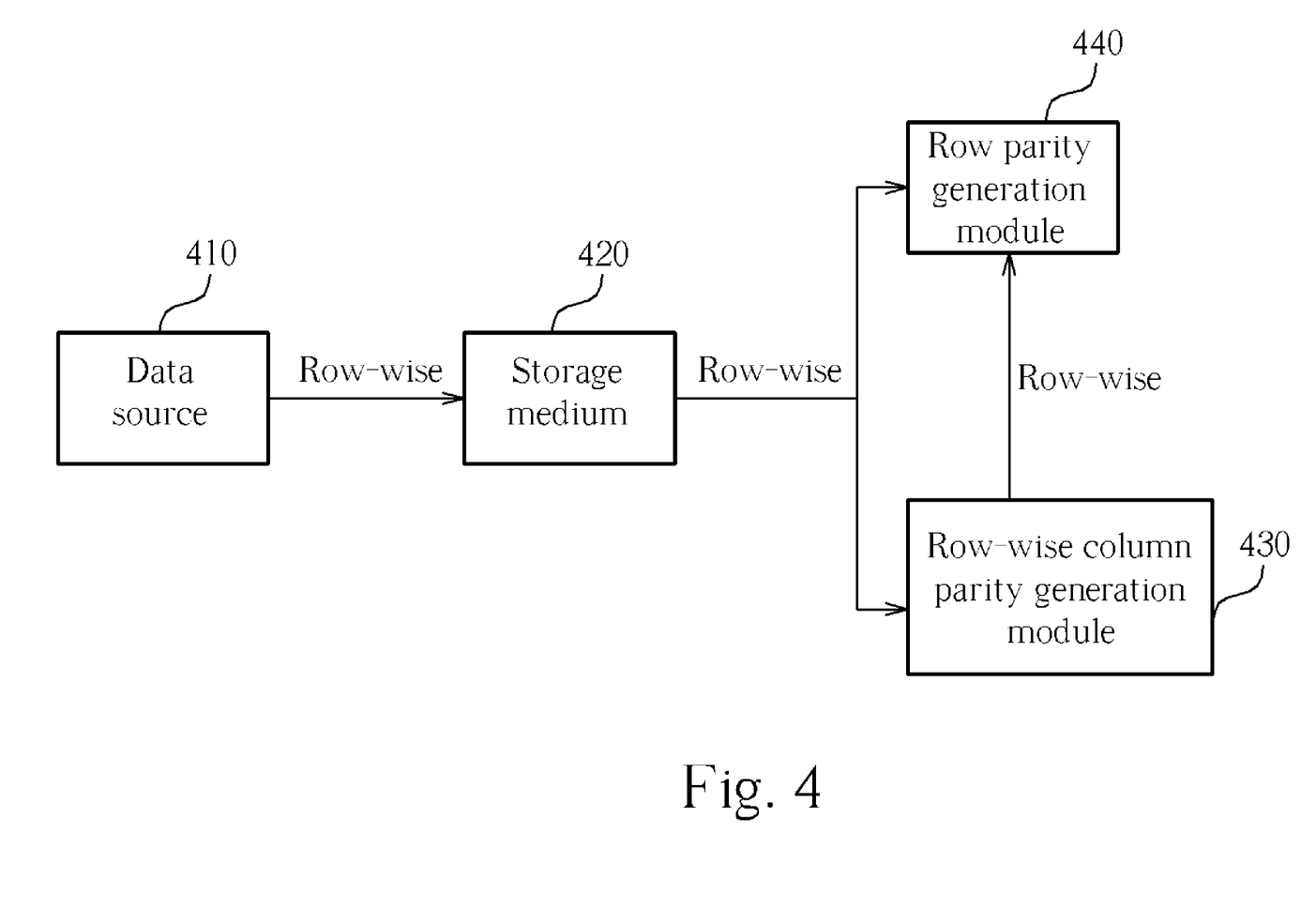
FIG. 4 to FIG. 7 are schematic diagrams illustrating how row parities and column parities are generated.

In FIG. 4, a data source 410 row-wise writes the original data block 110 into a storage medium 420. For example, the data source 410 is a host and the storage medium 420 is a DRAM or a static random access memory (SRAM). A row-wise column parity generation module 430 calculates the column parity block 120 by row-wise accessing the original data block 110 stored in the storage medium 420. For example, the row-wise column parity generation module 430 is realized by the apparatus 300 illustrated before, and the storage media 350 and 420 are realized by a single memory or two separate memories. The row parity generation module 440, which is realized by one of the compatible row parity generation modules of the related art, calculates the row-direction parity block 130 by row-wise accessing the original data block 110 stored in the storage medium 420 and row-wise accessing the column-direction parity block 120 generated by the row-wise column parity generation module 430. Since the row-wise column parity generation module 430 and the row parity generation module 440 functions concurrently, the column parity block 120 and the row parity block 130 are calculated simultaneously instead of being calculated one after another. Combining the original data block 110 stored in the storage medium 420, the column-direction parity block 120 generated by the row-wise column parity generation module 430, and the row-direction parity block 130 generated by the row parity generation module 440, the required ECC block 100 is formed.

Figure 5:
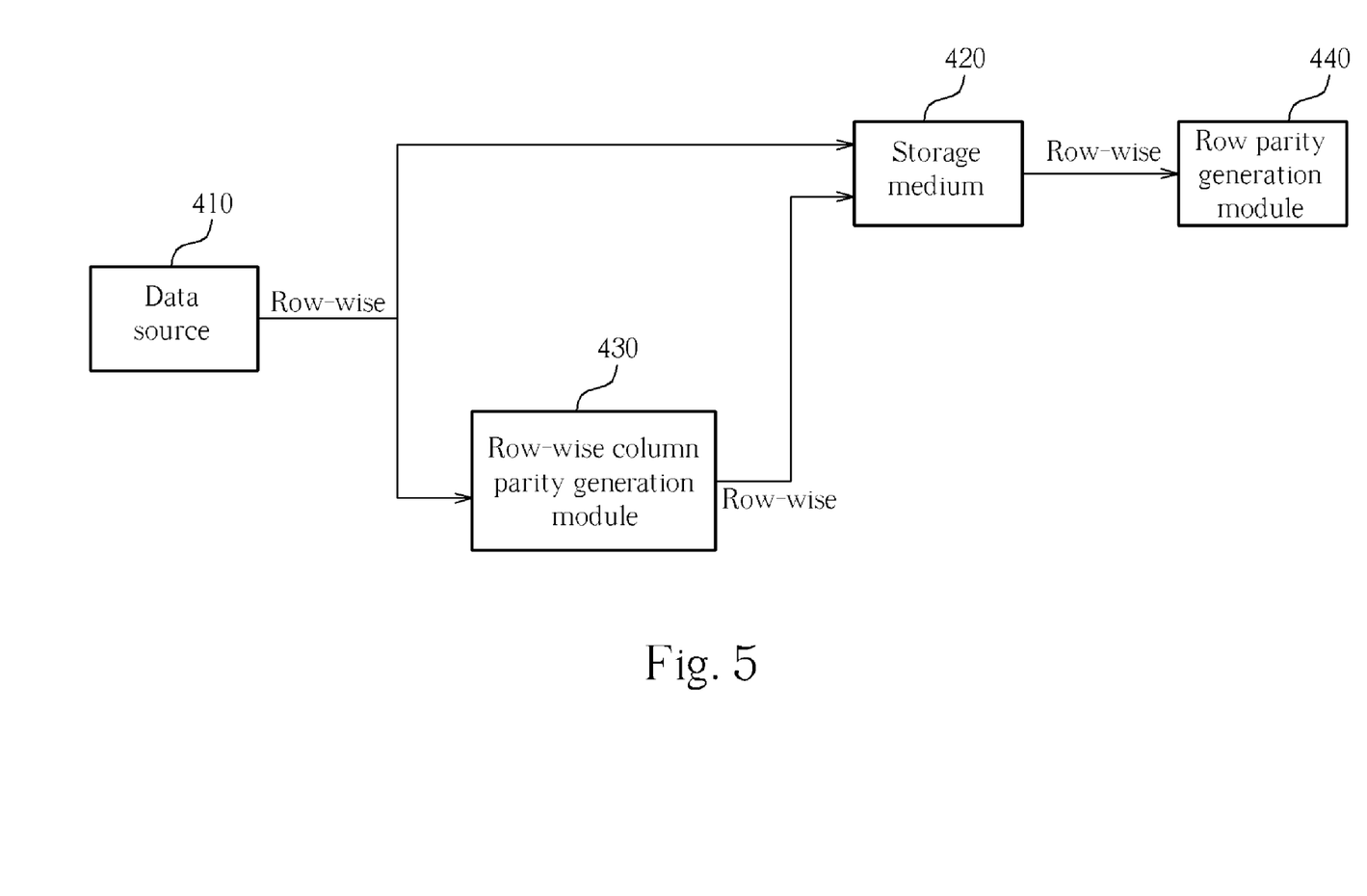

In FIG. 5, the data source 410 row-wise sends the original data block 110 to the storage medium 420 and the row-wise column parity generation module 430 simultaneously. The row-wise column parity generation module 430 calculates the column-direction parity block 120 according to the original data block 110 row-wise received from the data source 410. The row-wise column parity generation module 430 then sends the column-direction parity block 120 to the storage medium 420 along the row-direction. The row parity generation module 440 calculates the row-direction parity block 130 by row-wise accessing the original data block 110 and the column-direction parity block 120 stored in the storage medium 420. Combining the original data block 110 and the column-direction parity block 120 stored in the storage medium 420, and the row-direction parity block 130 generated by the row parity generation module 440, the required ECC block 100 is formed.

Figure 6:
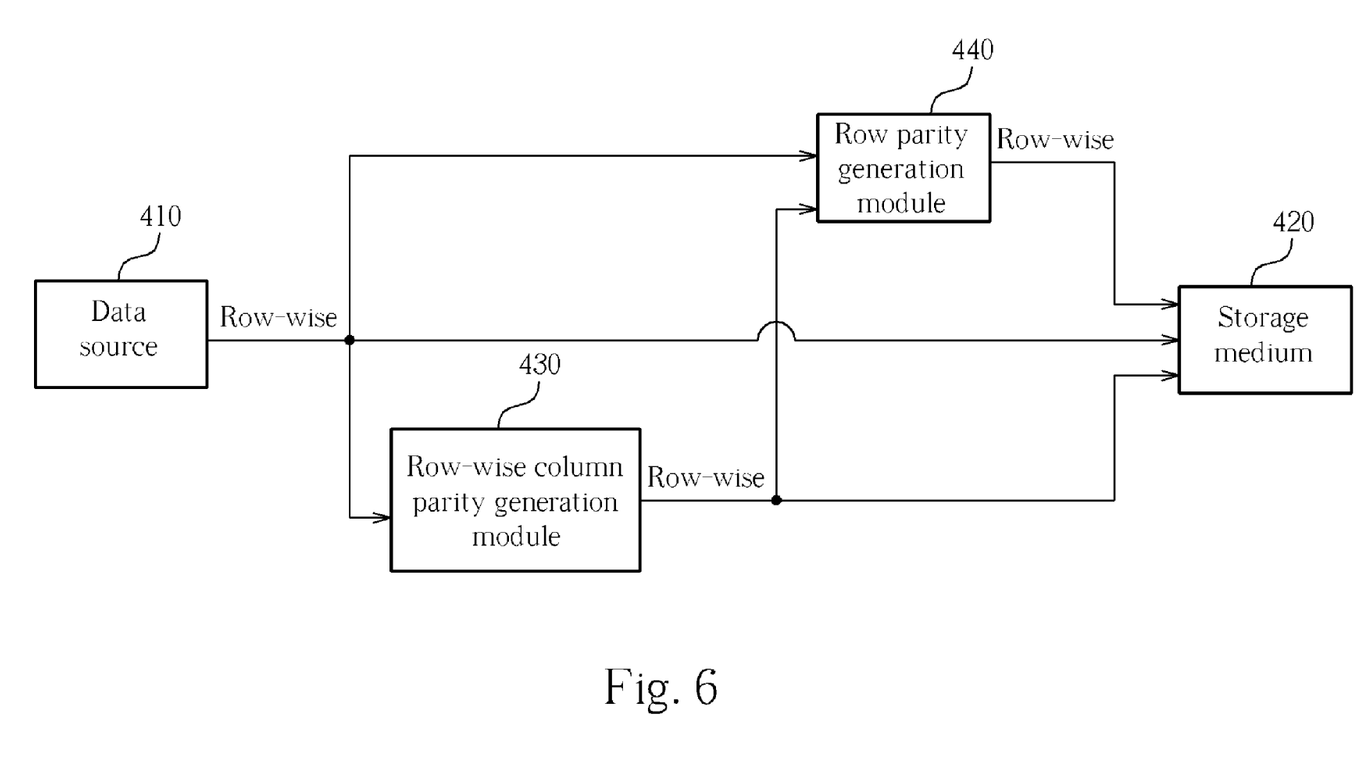

In FIG. 6, the data source 410 row-wise sends the original data block 110 to the storage medium 420, the row-wise column parity generation module 430, and the row parity generation module 440 simultaneously. The row-wise column parity generation module 430 calculates the column-direction parity block 120 according to the original data block 110 row-wise received from the data source 410. The row-wise column parity generation module 430 then sends the column-direction parity block 120 to the storage medium 420 and the row parity generation module 440 simultaneously. The row parity generation module 440 calculates the row-direction parity block 130 according to the original data block 110 row-wise received from the data source 410 and the column-direction parity block 120 row-wise received from the row-wise column parity generation module 430. The row parity generation module 440 then sends the row-direction parity block 130 to the storage medium 420. Combining the original data block 110, the column-direction parity block 120, and the row-direction parity block 130 stored in the storage medium 420, the required ECC block 100 is formed.

Figure 7:
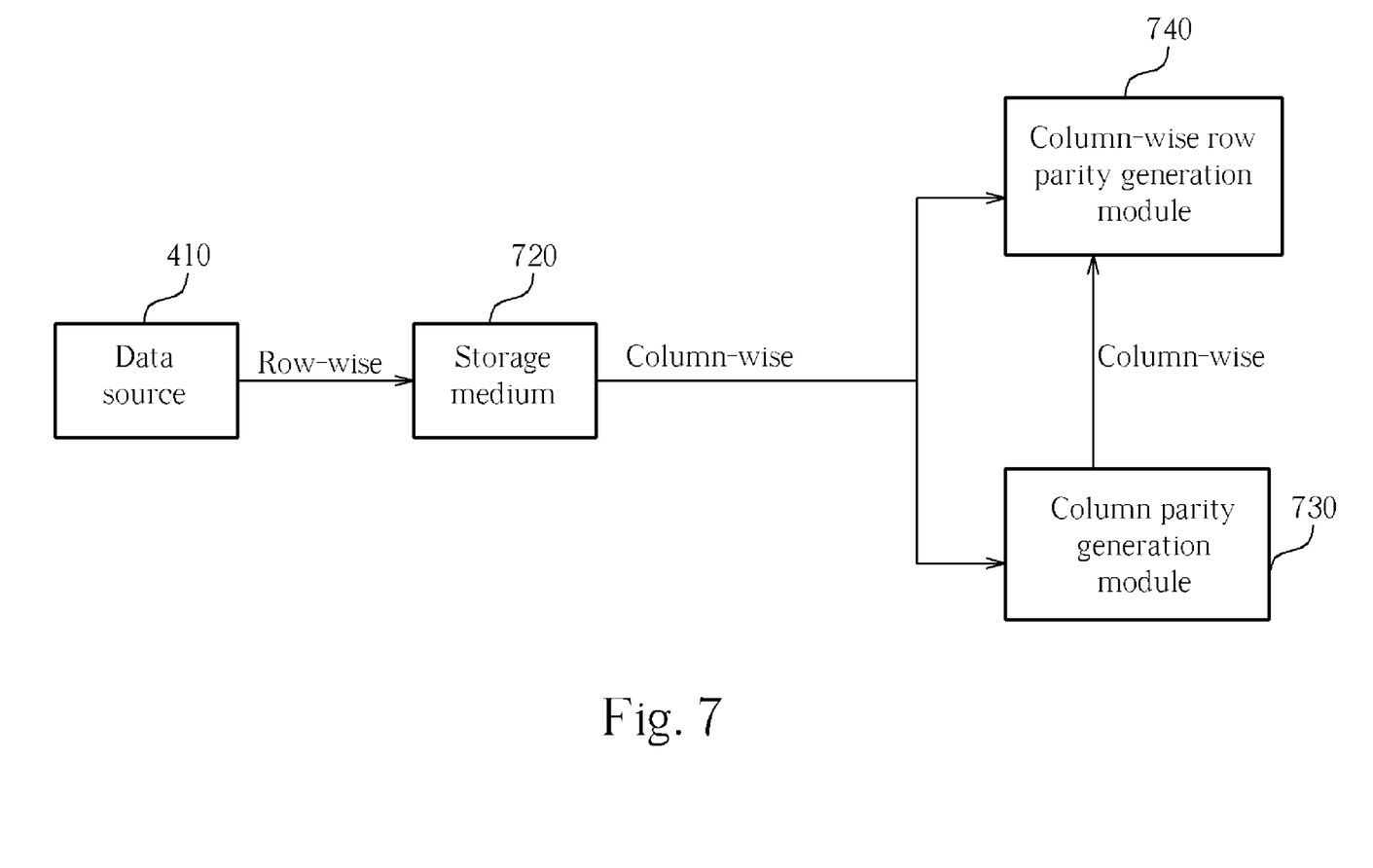

In FIG. 7, the data source 410 row-wise writes the original data block 110 into a storage medium 720. For example, the storage medium 920 is a SRAM. A column parity generation module 730 calculates the column-direction parity block 120 by column-wise accessing the original data block 110 stored in the storage medium 720. For example, the column parity generation module 730 is realized by one of the compatible column parity generation modules of the related art. The column-wise row parity generation module 740 calculates the row-direction parity block 130 by column-wise accessing a source data block consisting of the original data block 110 stored in the storage medium 720 and the column-direction parity block 120 generated by the column parity generation module 730. Combining the original data block 110 stored in the storage medium 720, the column-direction parity block 120 generated by the column parity generation module 730, and the row-direction parity block 130 generated by the column-wise row parity generation module 740, the required ECC block 100 is formed.

With the above-mentioned embodiments, the overall efficiency of generating ECC blocks is increased by avoiding utilizing the memories in an ineffective manner. Furthermore, the embodiments also allow multiple tasks to be executed concurrently.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A method implemented in an apparatus for generating parity symbols for a data block, the method comprising:

determining a multiplicator polynomial for a first-direction symbol line of the data block by the apparatus;

receiving a set of symbols on the first-direction symbol line by the apparatus, wherein the set of symbols corresponds to a set of second-direction symbol lines of the data block respectively;

multiplying the set of symbols by the multiplicator polynomial by the apparatus to generate a set of product polynomials for the set of second-direction symbol lines;

repeating the determining, receiving, and multiplying steps by the apparatus for a plurality of first-direction symbol lines of the data block to generate a plurality of sets of product polynomials for the set of second-direction symbol lines; and summing the plurality of sets of product polynomials by the apparatus to generate a set of parity polynomials for the set of second-direction symbol lines;

wherein coefficients of the set of parity polynomials constitute parity symbols of the set of second-direction symbol lines.

2. The method of claim 1, wherein the method further comprises:

pre-storing a plurality of multiplicator polynomials; and the step of determining the multiplicator polynomial for the first-direction symbol line of the data block comprises:

retrieving the multiplicator polynomial for the first-direction symbol line according to the line order of the first-direction symbol line in the data block.

3. The method of claim 1, wherein the step of determining the multiplicator polynomial for the first-direction symbol line of the data block comprises:

utilizing a recursive equation to determine the multiplicator polynomial for the target first-direction symbol line of the data block according to at least one of the known multiplicator polynomials for other first-direction symbol lines of the data block.

4. The method of claim 3, wherein the number of symbols included each of the set of second-direction symbol lines is A, the number of parity symbols included in each of the set of parity polynomials is B, the line order of the target first-direction symbol line and the known first-direction symbol line in the data block are (n−1) and n respectively, n is an integer between B+1 and A+B−1, and the recursive equation is as follows:

$$R_{n-1}(x) = R'_n(x) - Cr(n)[G'(x)/Cg]$$

where $R_{n-1}(x)$ is the multiplicator polynomial for the target first-direction symbol line, $R_n'(x)$ is the quotient polynomial of the known multiplicator polynomial divided by x, Cr(n) is the constant term of the known multiplicator polynomial, G'(x) is the quotient polynomial of a generation polynomial divided by x, and Cg is the constant term of the generation polynomial.

5. The method of claim 1, wherein the first-direction symbol lines are perpendicular to the second-direction symbol lines.

6. The method of claim 1, wherein the first-direction symbol lines are rows of the data block, and the second-direction symbol lines are columns of the data block.

7. The method of claim 1, wherein the first-direction symbol lines are columns of the data block, and the second-direction symbol lines are rows of the data block.

8. An apparatus for generating parity symbols for a data block, the apparatus comprising:

a determining module for determining a multiplicator polynomial for a first-direction symbol line of the data block;

a multiplication module coupled to the determining module, for receiving a set of symbols on the first-direction symbol line of the data block and multiplying each of the set of symbols by the multiplicator polynomial to generate a set of product polynomials, the set of symbols corresponding to a set of second-direction symbol lines of the data block respectively; and a summation module coupled to the multiplication module, for summing a plurality of sets of product polynomials generated by the multiplication module to generate a set of parity polynomials for the set of second-direction symbol lines;

wherein coefficients of the set of parity polynomials constitute parity symbols of the set of second-direction symbol lines.

9. The apparatus of claim 8, wherein the summation module comprises:

a storage medium for storing a set of summation polynomials; and an add module coupled to the multiplication module and the storage medium, for adding the set of product polynomials with the set of summation polynomials to generate a set of renewed summation polynomials, and for updating the set of summation polynomials stored in the storage medium with the set of renewed summation polynomials;

wherein a set of renewed summation polynomials finally generated by the add module is utilized as the set of parity polynomials for the set of second-direction symbol lines.

10. The apparatus of claim 8, wherein the first-direction symbol lines are perpendicular to the second-direction symbol lines.

11. The apparatus of claim 8, wherein the first-direction symbol lines are rows of the data block, and the second-direction symbol lines are columns of the data block.

12. The apparatus of claim 8, wherein the first-direction symbol lines are columns of the data block, and the second-direction symbol lines are rows of the data block.

13. An apparatus for generating a second-direction parity block and a first-direction parity block according to an original data block, the apparatus comprising:

a second-direction parity generation module, for calculating the second-direction parity block by accessing the original data block along the first-direction; and a first-direction parity generation module coupled to the second-direction parity generation module, for calculating the first-direction parity block by first-direction-wise accessing the original data block and the second-direction parity block generated by the second-direction parity generation module.

14. The apparatus of claim 13, wherein the second-direction parity generation module comprises:

a determining module for determining a multiplicator polynomial for a first-direction symbol line of the original data block;

a multiplication module coupled to the determining module, for receiving a set of symbols on the first-direction symbol line of the original data block and multiplying each of the set of symbols by the multiplicator polynomial to generate a set of product polynomials, the set of symbols corresponding to a set of second-direction symbol lines of the original data block respectively; and a summation module coupled to the multiplication module, for summing a plurality of sets of product polynomials generated by the multiplication module to generate a set of parity polynomials for the set of second-direction symbol lines;

wherein the second-direction parity block comprises coefficients of the set of parity polynomials.

15. The apparatus of claim 14, wherein the summation module comprises:

a storage medium for storing a set of summation polynomials; and an add module coupled to the multiplication module and the storage medium, for adding the set of product polynomials with the set of summation polynomials to generate a set of renewed summation polynomials, and for updating the set of summation polynomials stored in the storage medium with the set of renewed summation polynomials;

wherein a set of renewed summation polynomials finally generated by the add module is utilized as the set of parity polynomials for the set of second-direction symbol lines.

16. The apparatus of claim 14, wherein the first-direction symbol lines are perpendicular to the second-direction symbol lines.

17. The apparatus of claim 14, wherein the first-direction symbol lines are rows of the original data block, and the second-direction symbol lines are columns of the original data block.

18. An apparatus for generating a second-direction parity block and a first-direction parity block according to an original data block, the apparatus comprising:
 a second-direction parity generation module, for calculating the second-direction parity block by second-direction-wise accessing the original data block; and
 a first-direction parity generation module coupled to the second-direction parity generation module, for calculating the first-direction parity block by second-direction-wise accessing the original data block and the second-direction parity block generated by the second-direction parity generation module.

19. The apparatus of claim 18, wherein the original data block and the second-direction parity block constitute a source data block for the first-direction parity generation module, and the first-direction parity generation module comprises:
 a determining module for determining a multiplicator polynomial for a second-direction symbol line of the source data block;
 a multiplication module coupled to the determining module, for receiving a set of symbols on the second-direction symbol line of the source data block and multiplying each of the set of symbols by the multiplicator polynomial to generate a set of product polynomials, the set of symbols corresponding to a set of first-direction symbol lines of the source data block respectively; and
 a summation module coupled to the multiplication module, for summing a plurality of sets of product polynomials generated by the multiplication module to generate a set of parity polynomials for the set of first-direction symbol lines;

wherein the first-direction parity block comprises coefficients of the set of parity polynomials.

20. The apparatus of claim 19, wherein the summation module comprises:
 a storage medium for storing a set of summation polynomials; and
 an add module coupled to the multiplication module and the storage medium, for adding the set of product polynomials with the set of summation polynomials to generate a set of renewed summation polynomials, and for updating the set of summation polynomials stored in the storage medium with the set of renewed summation polynomials;

wherein a set of renewed summation polynomials finally generated by the add module is utilized as the set of parity polynomials for the set of first-direction symbol lines.

21. The apparatus of claim 19, wherein the first-direction symbol lines are perpendicular to the second-direction symbol lines.

22. The apparatus of claim 19, wherein the first-direction symbol lines are rows of the source data block, and the second-direction symbol lines are columns of the source data block.

* * * * *